United States Patent
Fettig et al.

(10) Patent No.: US 9,445,018 B2
(45) Date of Patent: Sep. 13, 2016

(54) IMAGING SYSTEMS WITH PHASE DETECTION PIXELS

(71) Applicant: Semiconductor Components Industries, LLC, Phoenix, AZ (US)

(72) Inventors: Douglas Fettig, Meridian, ID (US); Richard Scott Johnson, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 252 days.

(21) Appl. No.: 14/267,695

(22) Filed: May 1, 2014

(65) Prior Publication Data

US 2015/0319420 A1 Nov. 5, 2015

(51) Int. Cl.
| | |
|---|---|
| *H04N 13/02* | (2006.01) |
| *H04N 5/232* | (2006.01) |
| *H04N 5/225* | (2006.01) |
| *H04N 5/378* | (2011.01) |
| *H04N 5/335* | (2011.01) |
| *H04N 5/369* | (2011.01) |

(52) U.S. Cl.
CPC .......... *H04N 5/335* (2013.01); *H04N 5/23212* (2013.01); *H04N 5/3696* (2013.01); *H04N 13/02* (2013.01); *H04N 13/0228* (2013.01); *H04N 13/0257* (2013.01); *H04N 13/0296* (2013.01)

(58) Field of Classification Search
CPC ..................... H04N 13/0228; H04N 13/0257; H04N 13/0296
USPC ........................................................ 348/49
See application file for complete search history.

(56) References Cited

U.S. PATENT DOCUMENTS

| | | | |
|---|---|---|---|
| 2011/0025904 A1* | 2/2011 | Onuki | G02B 7/34 348/360 |
| 2012/0193515 A1 | 8/2012 | Agranov et al. | |
| 2013/0038691 A1 | 2/2013 | Agranov et al. | |
| 2013/0181309 A1* | 7/2013 | Johnson | H01L 31/02002 257/431 |
| 2013/0182158 A1* | 7/2013 | Kobayashi | H01L 31/02 348/294 |

(Continued)

OTHER PUBLICATIONS

"Canon Dual Pixel CMOS AF shows us what Olympus-Panasonic will have to do", 4/3 Rumors, Jul. 2, 2013, Retrieved from the Internet:URL:http://www.43rumors.com/canon-dual-pixel-cmos-af-shows-us-what-olympus-panasonic-will-have-to-do/ [retrieved on May 1, 2014].

*Primary Examiner* — Hee-Yong Kim
(74) *Attorney, Agent, or Firm* — Treyz Law Group, P.C.; Kendall P. Woodruff; Joseph F. Guihan

(57) ABSTRACT

An image sensor may include phase detection pixels that receive and convert incident light into pixel signals. Processing circuitry may use pixel signals from the phase detection pixels to determine an amount by which image sensor optics should be adjusted during automatic focusing operations. Phase detection pixels may include photodiodes with asymmetric angular responses. For example, the center of a photodiode in a phase detection pixel may be offset from the optical center of the microlens that covers that photodiode. A group of two, three, four, or more than four phase detection pixels may be clustered together and covered by a single microlens. Groups of these clusters may be arranged consecutively in a line. Phase data may be gathered using all of the phase detection pixels in the array, and image processing circuitry may determine which phase data to use after the data has been gathered.

20 Claims, 14 Drawing Sheets

(56) References Cited

U.S. PATENT DOCUMENTS

| | | |
|---|---|---|
| 2013/0222552 A1 | 8/2013 | Agranov et al. |
| 2013/0222662 A1* | 8/2013 | Sakurai ............ H04N 5/378 348/308 |
| 2015/0001589 A1* | 1/2015 | Tazoe ............ H01L 27/14603 257/229 |
| 2015/0062422 A1* | 3/2015 | Stern ............ H04N 5/2257 348/374 |

\* cited by examiner

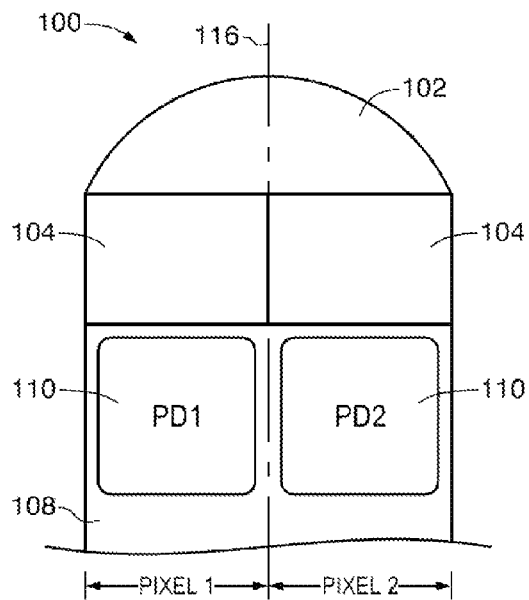
FIG. 2A
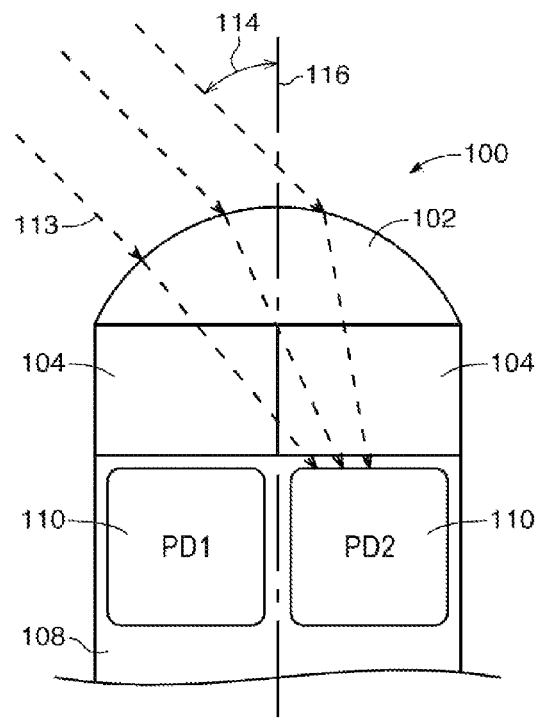 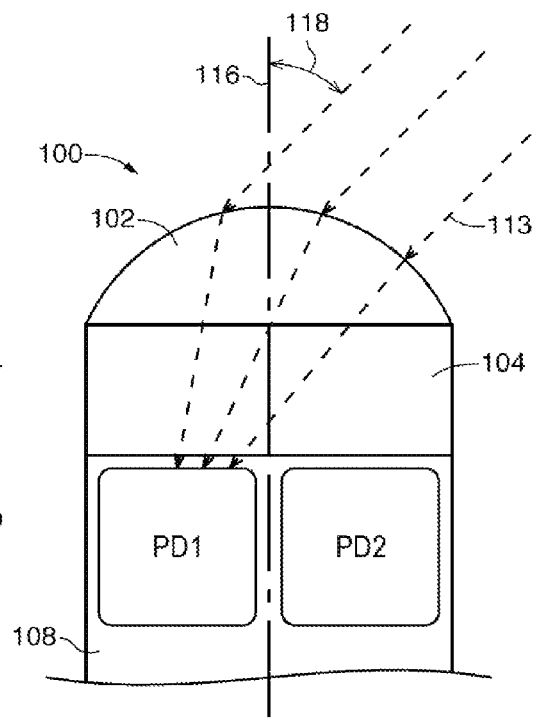
FIG. 2B  FIG. 2C

IMAGING SYSTEMS WITH PHASE DETECTION PIXELS

BACKGROUND

This relates generally to imaging systems and, more particularly, to imaging systems with phase detection capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Some applications such as automatic focusing and three-dimensional (3D) imaging may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

It would therefore be desirable to be able to provide improved imaging systems with depth sensing capabilities.

BRIEF DESCRIPTION OF THE DRAWINGS

FIG. 2A is a cross-sectional view of illustrative phase detection pixels having photosensitive regions with different and asymmetric angular responses in accordance with an embodiment of the present invention.

FIGS. 2B and 2C are cross-sectional views of the phase detection pixels of FIG. 2A in accordance with an embodiment of the present invention.

DETAILED DESCRIPTION

Figure 1:
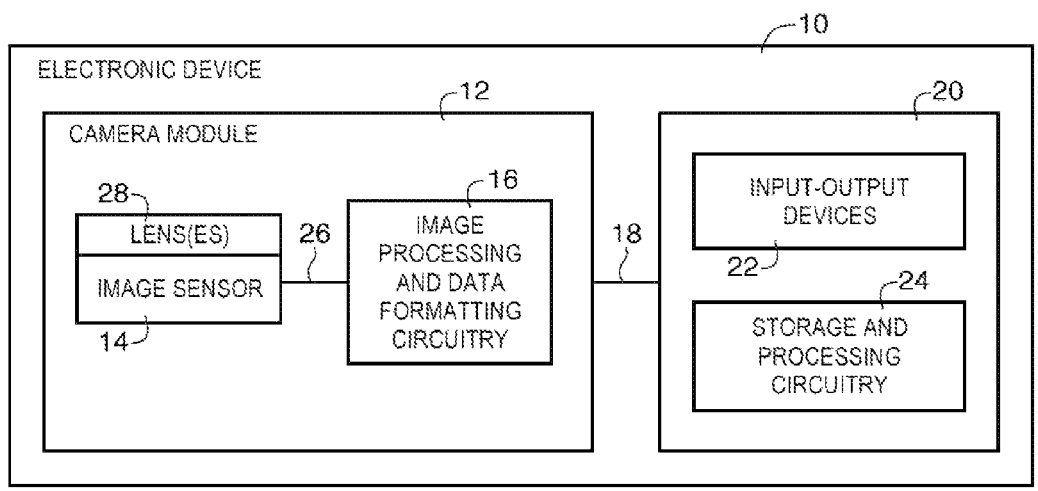
FIG. 1 is a schematic diagram of an illustrative electronic device with an image sensor that may include phase detection pixels in accordance with an embodiment of the present invention.

Embodiments of the present invention relate to image sensors with depth sensing capabilities. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-todigital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

It may be desirable to provide image sensors with depth sensing capabilities (e.g., to use in automatic focusing applications, 3D imaging applications such as machine vision applications, etc.). To provide depth sensing capabilities, image sensor 14 may include phase detection pixel groups such as pixel pair 100 shown in FIG. 2A.

FIG. 2A is an illustrative cross-sectional view of pixel pair 100. Pixel pair 100 may include first and second pixels such Pixel 1 and Pixel 2. Pixel 1 and Pixel 2 may include photosensitive regions such as photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the wavelengths corresponding to a green color, a red color, a blue color, a yellow color, visible light, infrared light, etc.). Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or back side illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

Figure 3:
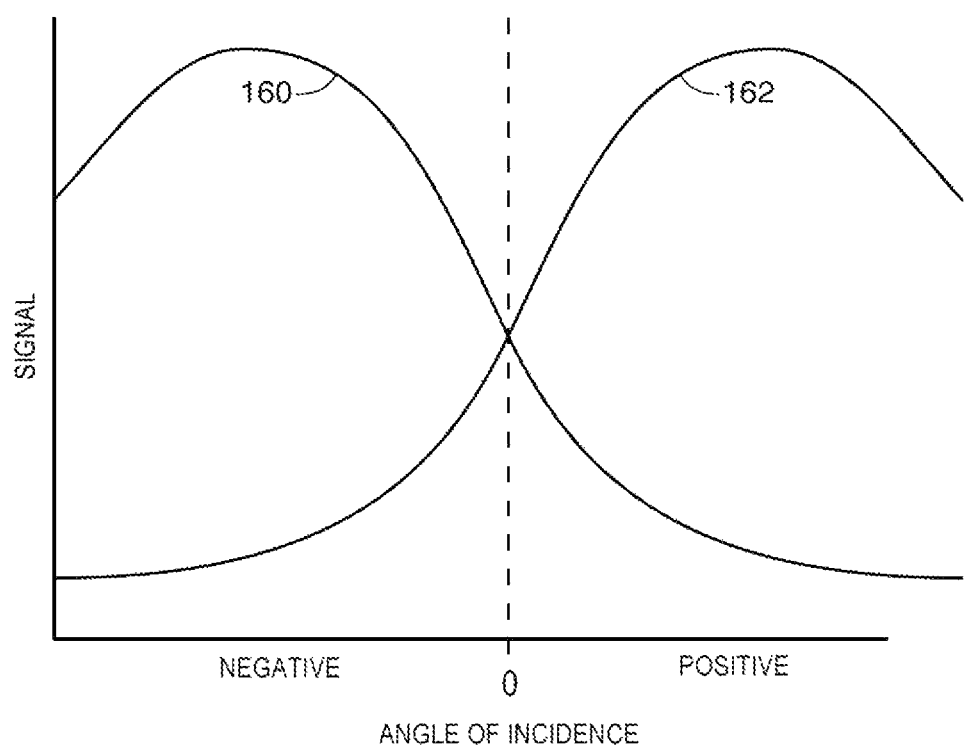
FIG. 3 is a diagram of illustrative signal outputs of photosensitive regions of depth sensing pixels for incident light striking the depth sensing pixels at varying angles of incidence in accordance with an embodiment of the present invention.

The positions of photodiodes PD1 and PD2 may sometimes be referred to as asymmetric positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). In the diagram of FIG. 3, an example of the image signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in image sensor 14 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel groups that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

Figure 4A:
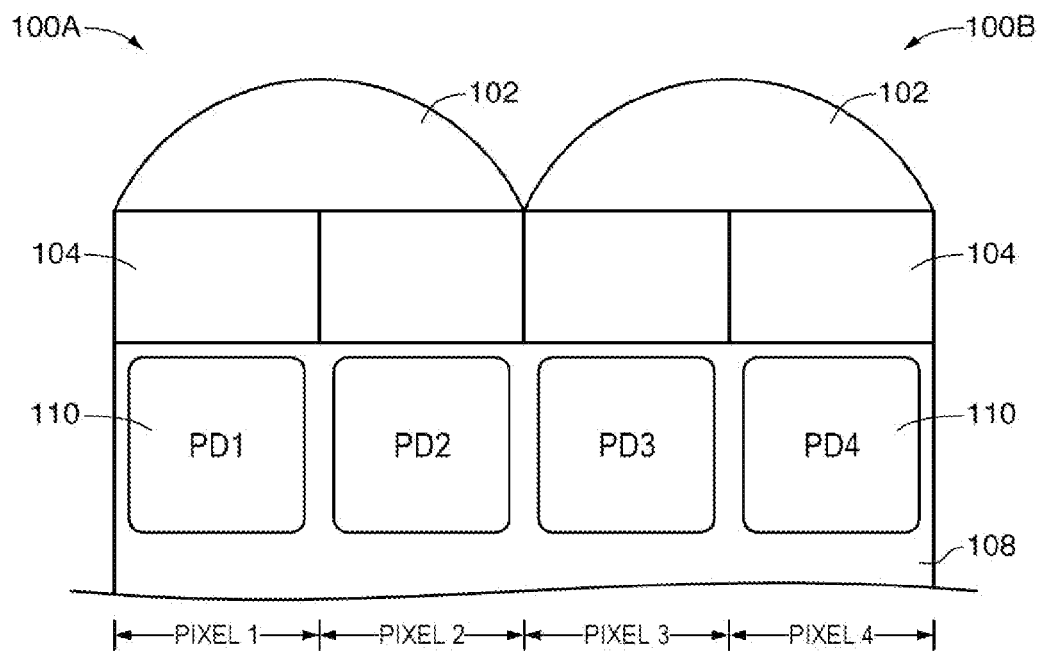
FIGS. 4A and 4B show respective cross-sectional and top views of an illustrative arrangement in which two phase detection pixel pairs are arranged consecutively in a line in accordance with an embodiment of the present invention.
Figure 4B:
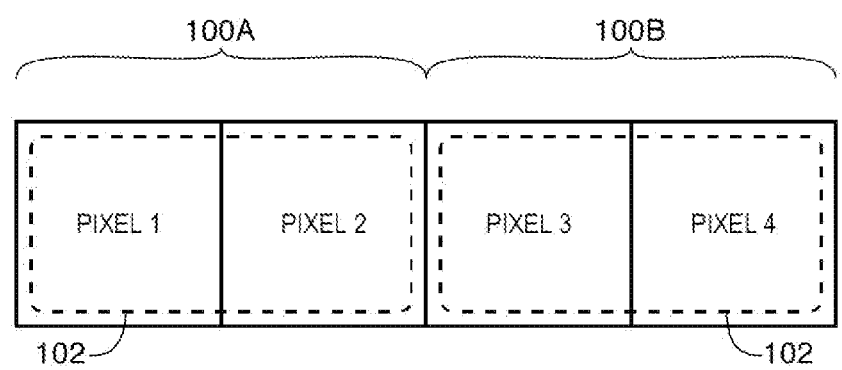

In some scenarios, it may be desirable to determine phase difference information using two or more pixel pairs that are located directly adjacent to one another. FIGS. 4A and 4B show respective cross-sectional side and top views of an illustrative arrangement in which two pixel pairs 100A and 100B are located directly adjacent to one another. As shown in FIG. 4A, each pixel pair may include first and second pixels having respective first and second photodiodes 110 covered by a single microlens 102. For example, pixel pair 100A includes Pixel 1 and Pixel 2 having respective photodiodes PD1 and PD2 covered by an associated microlens 102, and pixel pair 100B includes Pixel 3 and Pixel 4 having respective photodiodes PD3 and PD4 covered by an associated microlens 102. This type of arrangement may sometimes be referred to as a 1×4 or 4×1 arrangement because there are four phase detection pixels arranged consecutively in a line.

An arrangement of the type shown in FIG. 4A may be used in various ways. For example, pixel pairs 100A and 100B may each be used to gather phase information and the data gathered by both pairs may be averaged to increase the accuracy of the phase difference signal. With this type of configuration, pixel pair 100A may be used to determine a first phase difference signal (e.g., just as phase difference signals are determined using pixel 100 of FIG. 2A), while pixel pair 100B may be used at the same time to determine a second phase difference signal (e.g., just as phase difference signals are determined using pixel 100 of FIG. 2A). The first and second phase difference signals may be averaged to obtain a final phase difference signal (if desired).

In some scenarios, it may be desirable to determine a phase difference signal using photodiodes with a greater distance of separation from each other than that shown in FIGS. 2A, 2B, and 2C. For example, the separation distance D between photodiodes PD1 and PD2 of FIG. 2A may be suitable for determining phase difference information for a given point spread function (also known as lens blur). For a different point spread function, however, it may be desirable to have a different (e.g., larger) distance between photodiodes 110.

The arrangement of FIG. 4A may be advantageous in determining phase difference information for different point spread functions. For example, phase difference information for a first point spread function may be determined using signals gathered by photodiodes PD1 and PD2 of FIG. 4A. For a second point spread function, phase difference information may be determined using signals gathered by photodiodes PD1 and PD4. For example, a phase difference signal may be calculated by subtracting the pixel signal output of PD1 from the pixel signal output of PD4. For an object at a distance that is less than the focused object distance, the phase difference signal may be negative. For an object a distance that is greater than the focused object distance, the phase difference signal may be positive. This information may be used to automatically adjust the image sensor optics to bring the object of interest into focus.

Because the separation between photodiodes PD1 and PD4 is greater than the separation between photodiodes PD1 and PD2, photodiodes PD1 and PD4 may be useful in determining phase difference information when the optical blur of the imaging system is relatively high. If desired, image processing circuitry 16 of FIG. 1 may determine which phase detection pixel data to use after the data is gathered. For example, during automatic focusing operations, phase detection pixel data may be gathered using Pixels 1, 2, 3, and 4. Image processing circuitry 16 of FIG. 1 may determine which phase detection pixel data to use (e.g., pixel data from Pixels 1 and 4 or pixel data from Pixels 1 and 2) to determine phase difference information for automatic focusing. Image processing circuitry 16 may, for example, determine which pixel data to use based on the point spread function of the imaging system. After determining which pixel data to use (e.g., after determining whether to use pixel data from PD1 and PD4 or from PD1 and PD2), image processing circuitry 16 may determine phase difference information based on that pixel data which may in turn be used to adjust the position of image sensor optics (e.g., lenses 28 of FIG. 1) to bring the object of interest into focus.

Figure 5A:
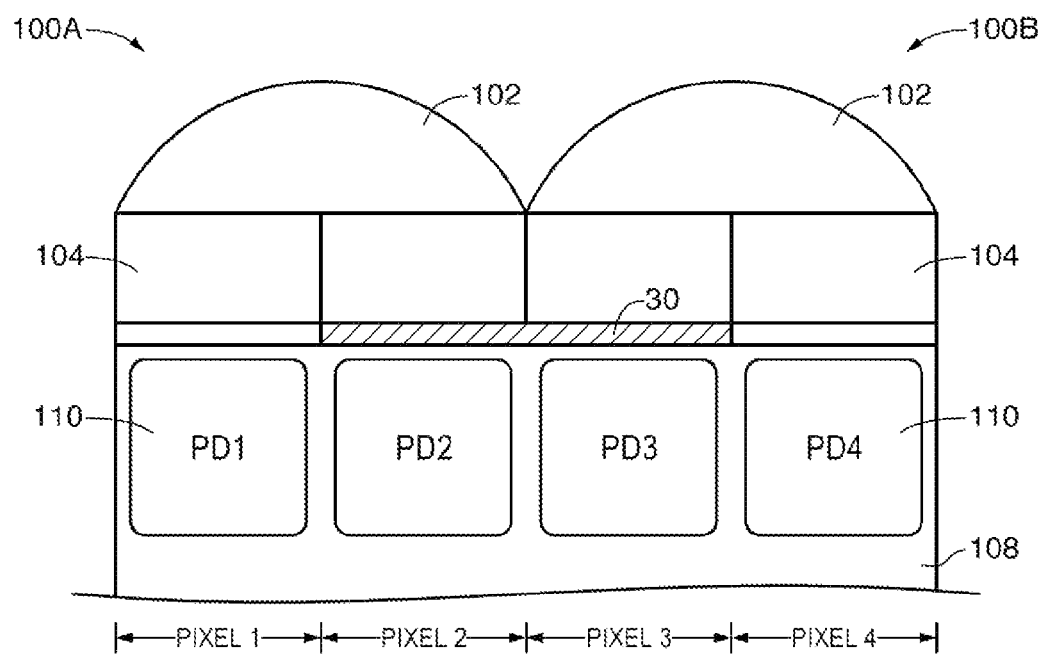
FIGS. 5A and 5B show respective cross-sectional and top views of an illustrative arrangement in which two phase detection pixel pairs are arranged consecutively in a line and in which one phase detection pixel from each pair is optically shielded in accordance with an embodiment of the present invention.
Figure 5B:
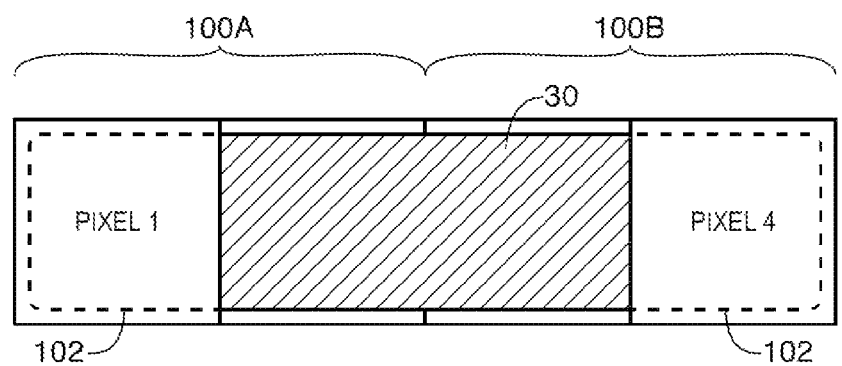

FIGS. 5A and 5B show respective cross-sectional side and top views of an illustrative arrangement in which two pixel pairs 100A and 100B are located directly adjacent to one another and in which the two middle photodiodes are optically shielded. As shown in FIG. 5A, pixel pair 100A includes Pixel 1 and Pixel 2 having respective photodiodes PD1 and PD2 covered by an associated microlens 102, and pixel pair 100B includes Pixel 3 and Pixel 4 having respective photodiodes PD3 and PD4 covered by an associated microlens 102. Pixels 2 and 3 may be optically shielded. For example, inner photodiodes PD2 and PD3 corresponding respectively to Pixels 2 and 3 may be optically shielded by an opaque shielding layer such as opaque shielding layer 30.

Illustrative examples of materials that may be used to form opaque shielding layer 30 include copper, aluminum, tungsten, oxide, silicon carbide, silicon nitride, titanium nitride, tantalum nitride, other suitable materials (e.g., other suitable metals, ceramics, etc.), or a combination of any two or more of these materials. In the example of FIG. 5A, opaque shielding layer 30 is interposed between color filters 104 and photodiodes PD2 and PD3. This is, however, merely illustrative. If desired, opaque shielding layer 30 may be formed in other locations (e.g., layer 30 may be incorporated into color filter elements 104).

With a configuration of the type shown in FIG. 5A, phase difference information may be determined using signals gathered by photodiodes PD1 and PD4. For example, a phase difference signal may be calculated by subtracting the pixel signal output of PD1 from the pixel signal output of PD4. For an object at a distance that is less than the focused object distance, the phase difference signal may be negative. For an object a distance that is greater than the focused object distance, the phase difference signal may be positive. This information may be used to automatically adjust the image sensor optics to bring the object of interest into focus.

Photodiodes PD2 and PD3 may, if desired, be used to collect overflow charge from photodiodes PD1 and PD4, respectively, during charge integration. For example, a blooming path may be formed between photodiodes PD1 and PD2 to increase the full-well capacity of pixel 1. A similar blooming path may be formed between photodiodes PD3 and PD4 to increase the full-well capacity of pixel 4.

Figure 6A:
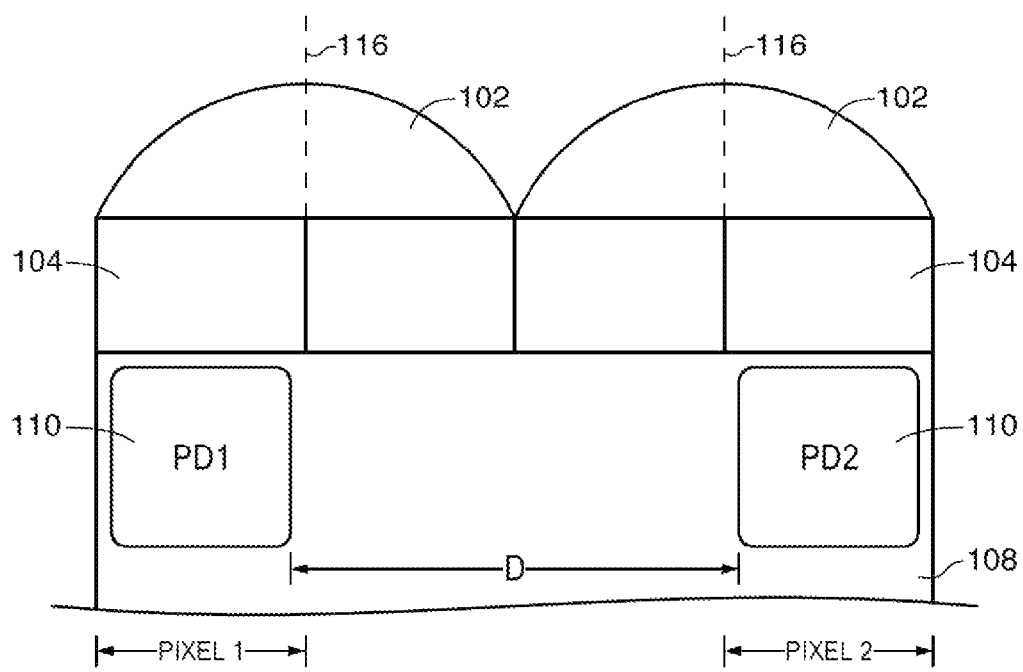
FIGS. 6A and 6B show respective cross-sectional and top views of an illustrative arrangement in which a phase detection pixel pair includes first and second photodiodes covered by respective first and second microlenses in accordance with an embodiment of the present invention.
Figure 6B:
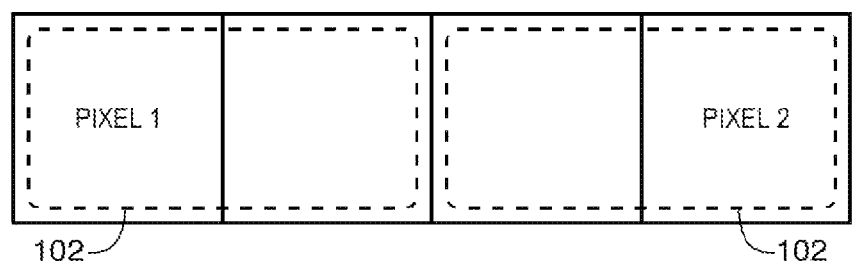

FIGS. 6A and 6B show respective cross-sectional side and top views of an illustrative arrangement in which a phase detection pixel pair is formed from a first pixel located under a first microlens and a second pixel located under a second microlens. As shown in FIG. 6A, Pixel 1 includes photodiode PD1 covered by an associated microlens 102, and Pixel 2 includes photodiode PD2 covered by an associated microlens 102. The centers of photodiodes PD1 and PD2 may each be offset from (i.e., not aligned with) optical axis 116 of associated microlens 102. The portion of substrate 108 under microlens 102 that is not occupied by photodiodes PD1 and PD2 (e.g., the portion of substrate 108 that extends from PD1 to PD1) may be free of photosensitive regions. This type of arrangement may be used to help prevent blooming.

With a configuration of the type shown in FIG. 6A, phase difference information may be determined using signals gathered by photodiodes PD1 and PD2. For example, a phase difference signal may be calculated by subtracting the pixel signal output of PD1 from the pixel signal output of PD2. For an object at a distance that is less than the focused object distance, the phase difference signal may be negative. For an object a distance that is greater than the focused object distance, the phase difference signal may be positive. This information may be used to automatically adjust the image sensor optics to bring the object of interest into focus.

If desired, the distance D between photodiodes PD1 and PD2 and the size of photodiodes PD1 and PD2 may be adjusted to optimize image sensor performance (e.g., may be adjusted to balance image sensor performance parameters such as phase separation, pixel sensitivity, full-well capacity, etc.).

Figure 7A:
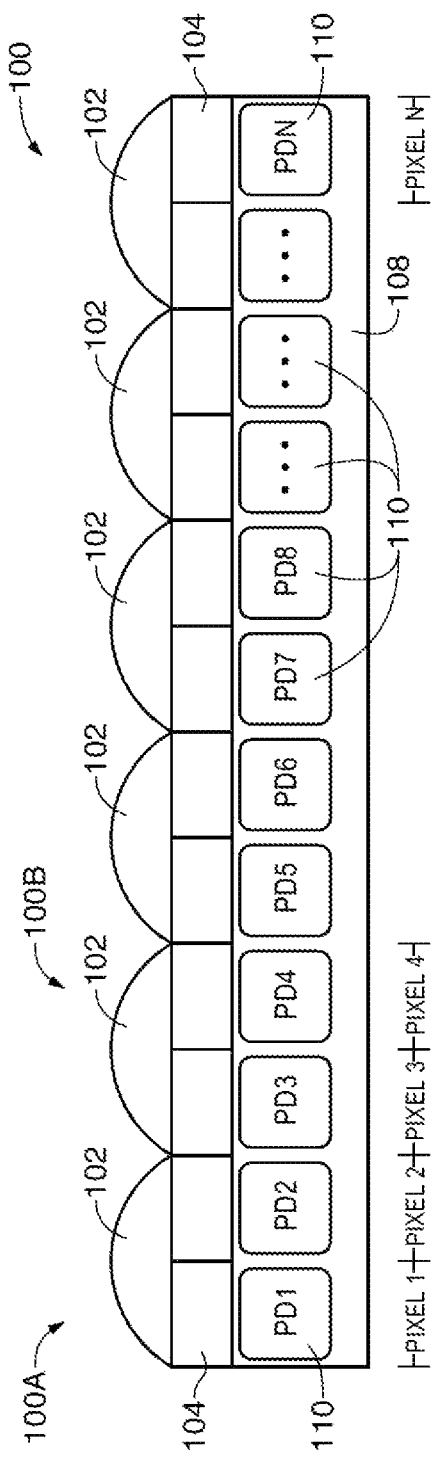
FIGS. 7A and 7B show respective cross-sectional and top views of an illustrative arrangement in which a plurality of phase detection pixel pairs are arranged consecutively in a line in accordance with an embodiment of the present invention.
Figure 7B:
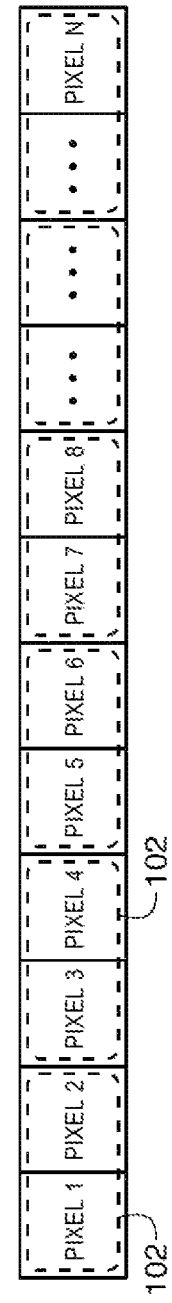

FIGS. 7A and 7B show respective cross-sectional side and top views of an illustrative arrangement in which a plurality of phase detection pixel pairs 100 are arranged consecutively in a line. As shown in FIG. 7A, each pixel pair 100 may include first and second pixels having respective first and second photodiodes 110 covered by a single microlens 102. For example, pixel pair 100A includes Pixel 1 and Pixel 2 having respective photodiodes PD1 and PD2 covered by an associated microlens 102, and pixel pair 100B includes Pixel 3 and Pixel 4 having respective photodiodes PD3 and PD4 covered by an associated microlens 102. Phase detection pixel pairs 100 are arranged consecutively in a line (e.g., in a row or column), with pixel N at the end of the line (where N is an even number). This type of arrangement is sometimes referred to as an N×1 arrangement because there are N phase detection pixels arranged consecutively in a line.

An arrangement of the type shown in FIG. 7A may be used in various ways. If desired, pixel pairs 100 may each be used to gather phase information and the data gathered by each pair may be averaged to increase the accuracy of the phase difference signal. For example, pixel pair 100A may be used to determine a first phase difference signal (e.g., just as phase difference signals are determined using pixel 100 of FIG. 2A), while pixel pair 100B may be used at the same time to determine a second phase difference signal (e.g., just as phase difference signals are determined using pixel 100 of FIG. 2A). The first and second phase difference signals may be averaged to obtain a final phase difference signal. The use of pixel pair 100A and pixel pair 100B is merely illustrative. In general, phase difference signals from any two or more of pixel pairs 100 may be averaged to obtain a final phase difference signal.

The arrangement of FIG. 7A may be advantageous in determining phase difference information for different point spread functions. For example, phase difference information for a first point spread function may be determined using signals gathered by photodiodes PD1 and PD2 of FIG. 7A. For a second point spread function, phase difference information may be determined using signals gathered by photodiodes PD1 and PD8. For example, a phase difference signal may be calculated by subtracting the pixel signal output of PD1 from the pixel signal output of PD8. For an object at a distance that is less than the focused object distance, the phase difference signal may be negative. For an object a distance that is greater than the focused object distance, the phase difference signal may be positive. This information may be used to automatically adjust the image sensor optics to bring the object of interest into focus.

Because the separation between photodiodes PD1 and PD8 is greater than the separation between photodiodes PD1 and PD2, photodiodes PD1 and PD8 may be useful in determining phase difference information when the optical blur of the imaging system is relatively high. If desired, image processing circuitry 16 of FIG. 1 may determine which pixel data to use after data is gathered. For example, during automatic focusing operations, phase detection pixel data may be gathered using all phase detection pixels, and image processing circuitry 16 of FIG. 1 may determine which phase detection pixel data to use to determine phase difference information for automatic focusing.

Pixel data from any suitable pair of photodiodes 110 may be used to determine phase difference information. For example, phase difference information may be determined based on pixel data from photodiode pairs PD1 and PD2, PD1 and PD4, PD3 and PD6, PD3 and PD8, PD5 and PD8, PD1 and PDN, etc. In general, any pair of photodiodes with complementary directional sensitivity (e.g., a first photodiode that is more sensitive to light with positive angles of incidence than light with negative angles of incidence and a second photodiode that is more sensitive to light with negative angles of incidence than light with positive angles of incidence) may be used in determining a phase difference signal.

If desired, image processing circuitry 16 may switch from using data from one pixel pair to using data from another pixel pair for determining a phase difference signal. For example, during a first automatic focusing operation, image processing circuitry 16 may use pixel data from photodiodes PD1 and PD4 to determine how image sensor optics should be adjusted to bring the object of interest into focus. During a second, subsequent automatic focusing operation, image processing circuitry 16 may use pixel data from photodiodes PD1 and PD2 to determine how image sensor optics should be adjusted to bring the object of interest into focus.

Figure 8A:
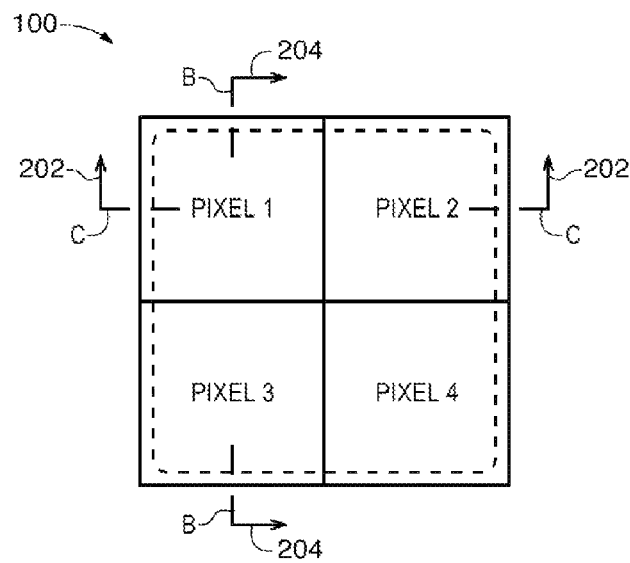
FIG. 8A is a top view of an illustrative phase detection pixel group having four photodiodes covered by a single microlens in accordance with an embodiment of the present invention.

The examples of FIGS. 2A-7B in which each photodiode 110 consumes about half of the substrate area under microlens 102 is merely illustrative. If desired, the size of microlens 102 (or photodiode 110) may be adjusted such that each phase detection photodiode 110 consumes less than half of the substrate area under microlens 102. FIG. 8A shows a top view of an illustrative arrangement in which microlens 102 covers four pixels in a 2×2 arrangement. With this type of configuration, phase detection pixel group 100 includes four pixels (Pixels 1, 2, 3, and 4) each having an associated photodiode (PD1, PD2, PD3, and PD4, respectively). Pixel groups such as pixel group 100 having four photodiodes arranged in a 2×2 formation and covered by a single microlens may sometimes be referred to as "super pixels."

Figures 8B, 8C:
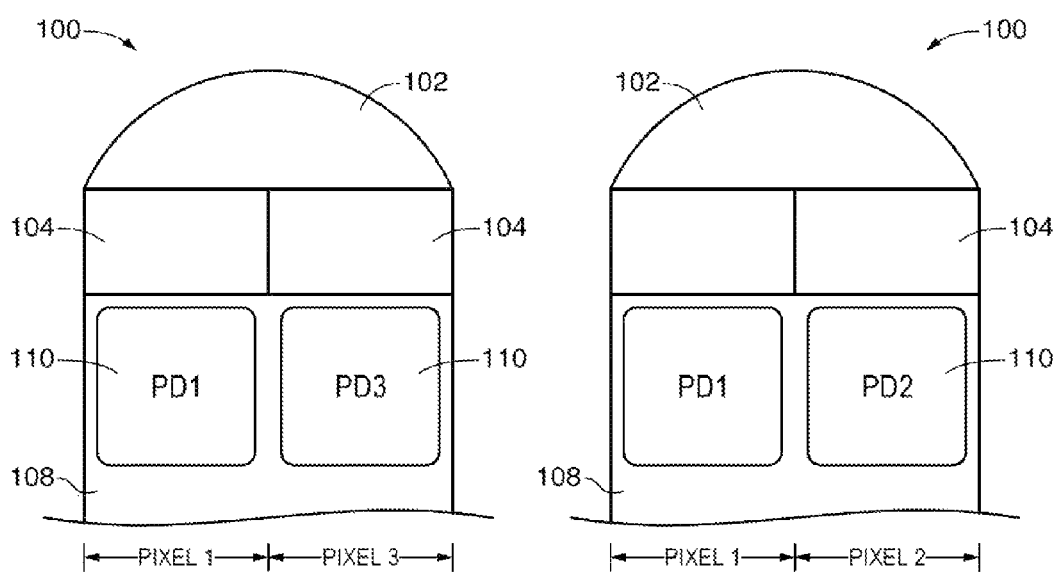
FIGS. 8B and 8C are cross-sectional view of the phase detection pixel group of FIG. 8A in accordance with an embodiment of the present invention.

FIG. 8B shows a cross-sectional side view of super pixel 100 of FIG. 8A taken along line B and viewed in direction 204. FIG. 8C shows a cross-sectional side view of super pixel 100 of FIG. 8A taken along line C and viewed in direction 202. Using the 2×2 arrangement of FIG. 8A in which microlens 102 covers four photodiodes 110, phase detection pixel group 100 may be used to gather phase information on horizontally oriented edges, vertically oriented edges, and edges that are oriented at various tilted angles.

For example, Pixels 1 and 2 of FIG. 8C may be used in conjunction with Pixels 3 and 4 to detect horizontal edges of an object of interest, while Pixels 1 and 3 may be used in conjunction with Pixels 2 and 4 to detect vertical edges of the object of interest. This may include, for example, summing pixel signals from photodiodes PD1 and PD3, summing pixel signals from photodiodes PD2 and PD4, and determining the difference between the two sums to calculate a phase difference associated with a vertical edge.

This is, however, merely illustrative. In general, image processing circuitry 16 may perform any number of operations using pixel data from pixel group 100 to determine phase information. If desired, all four phase detection pixels in group 100 may gather phase information and image processing circuitry 16 may determine which data to use after it has been gathered. If desired, image processing circuitry 16 may only use a portion of the gathered data.

Figure 9A:
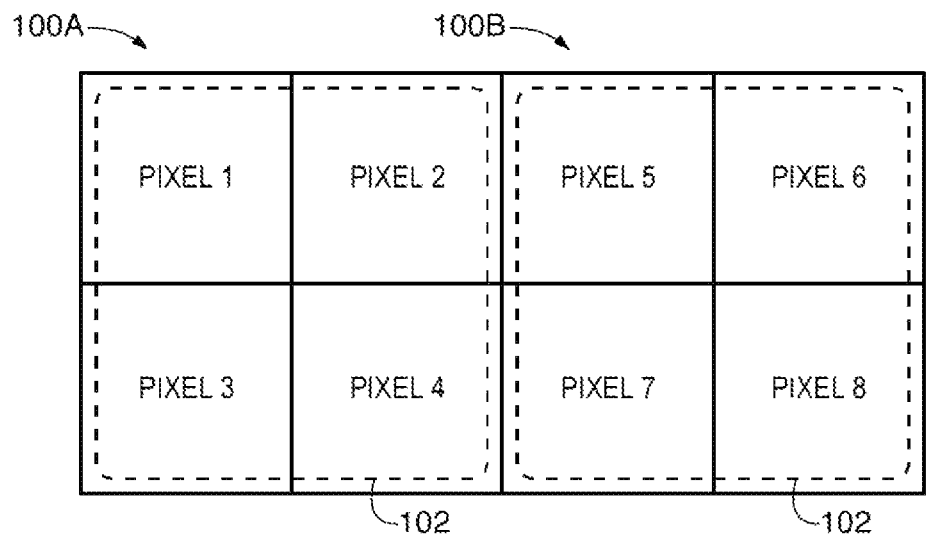
FIGS. 9A and 9B show respective top and cross-sectional views of an illustrative arrangement in which two phase detection pixel groups with four photodiodes in each group are arranged side-by-side in accordance with an embodiment of the present invention.
Figure 9B:
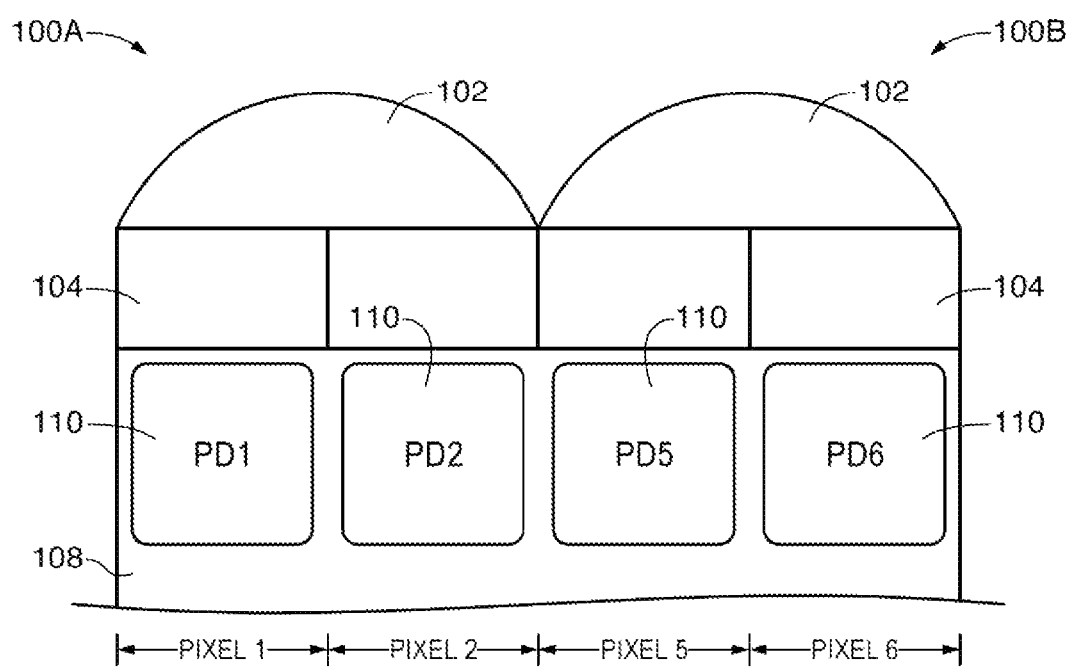

If desired, 2×2 pixel groups 100 of the type shown in FIG. 8A may arranged consecutively in a line. FIGS. 9A and 9B show respective top and side cross-sectional views of an illustrative arrangement in which two 2×2 pixel groups 100 are arranged consecutively in a line. This type of arrangement is sometimes referred to as a 2×4 or 4×2 arrangement because there are eight phase detection pixels arranged in two consecutive lines with four pixels per line.

An arrangement of the type shown in FIG. 9A may be used in various ways. For example, pixel groups 100A and 100B may each be used to gather phase information and the data gathered by the groups may be averaged to increase the accuracy of the phase difference signal.

The arrangement of FIG. 9A may be advantageous in determining phase difference information for different point spread functions. For example, phase difference information for a first point spread function may be determined using signals gathered by pixel group 100A FIG. 9A (e.g., by summing signals from PD1 and PD3, summing signals from PD2 and PD4, and determining the difference between the two sums). For a second point spread function, phase difference information may be determined using signals gathered pixels in groups 100A and 100B (e.g., by summing signals from PD1 and PD3, summing signals from PD6 and PD8, and determining the difference between the two sums).

If desired, image processing circuitry 16 of FIG. 1 may determine which pixel data to use for automatic focusing operations after data is gathered. For example, during automatic focusing operations, phase detection pixel data may be gathered using all phase detection pixels in groups 100A and 100B, and image processing circuitry 16 of FIG. 1 may determine which phase detection pixel data to use to determine phase difference information for automatic focusing after the data has been gathered.

Figure 10A:
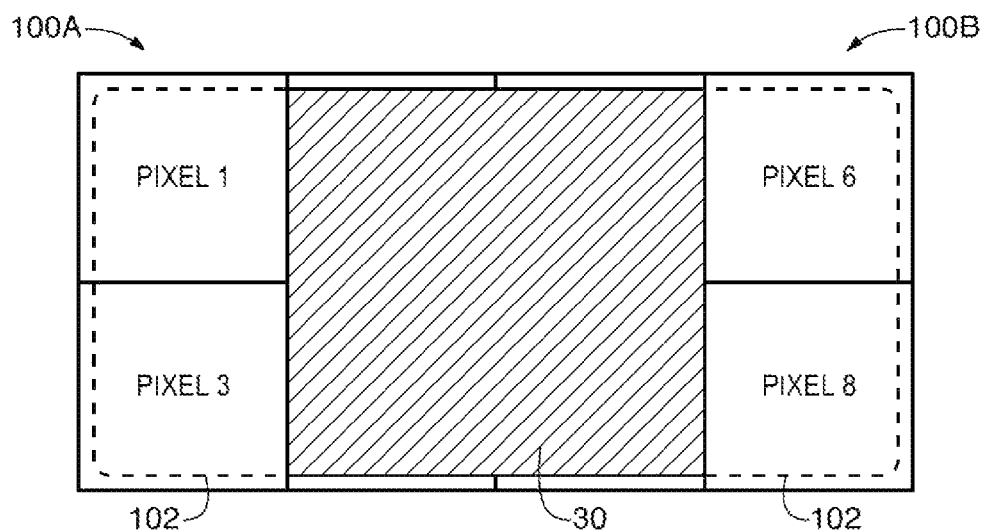
FIGS. 10A and 10B show respective top and cross-sectional views of an illustrative arrangement in which two phase detection pixel groups having four photodiodes in each group are arranged side-by-side and in which two phase detection pixels from each group are optically shielded in accordance with an embodiment of the present invention.
Figure 10B:
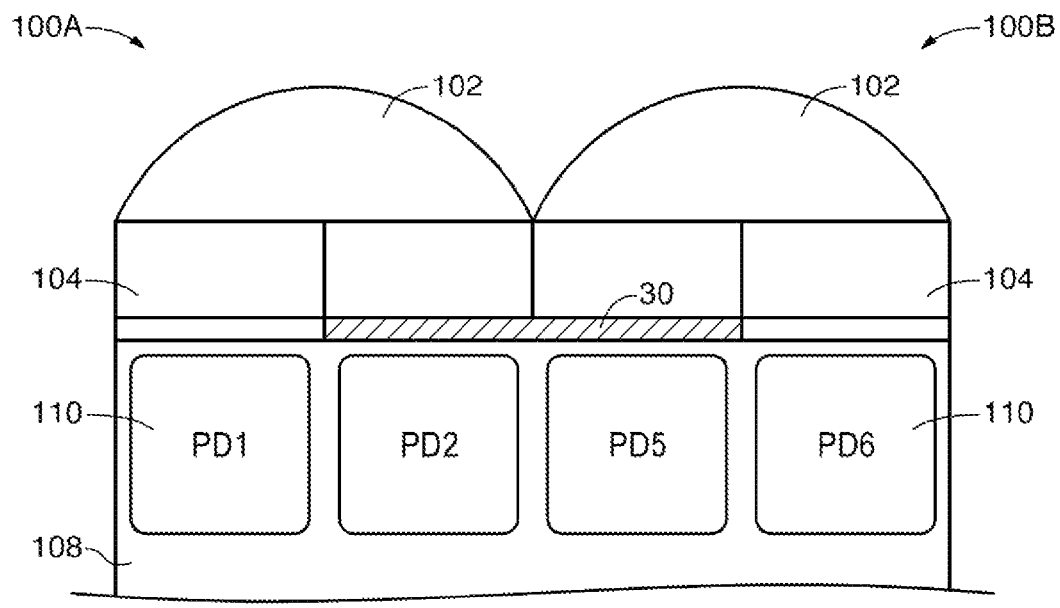

FIGS. 10A and 10B show respective top and cross-sectional side views of an illustrative arrangement in which two pixel groups 100A and 100B are located directly adjacent to one another and in which the four middle photodiodes are covered by an opaque shield. As shown in FIG. 10A, the four inner pixels (Pixels 2 and 4 from group 100A and Pixels 5 and 7 from group 100B) are optically shielded by an opaque shielding layer such as opaque shielding layer 30.

Illustrative examples of materials that may be used to form opaque shielding layer 30 include copper, aluminum, tungsten, oxide, silicon carbide, silicon nitride, titanium nitride, tantalum nitride, other suitable materials (e.g., other suitable metals, ceramics, etc.), or a combination of any two or more of these materials. In the example of FIG. 10B, opaque shielding layer 30 is interposed between color filters 104 and photodiodes 110 (e.g., PD2, PD4, PD5, and PD7). This is, however, merely illustrative. If desired, opaque shielding layer 30 may be formed in other locations (e.g., layer 30 may be incorporated into color filter elements 104).

With a configuration of the type shown in FIG. 10A, phase difference information may be determined using signals gathered by photodiodes PD1, PD3, PD6, and PD8. This may include, for example, summing signals from PD1 and PD3, summing signals from PD6 and PD8, and determining a difference between the two sums. Image processing circuitry 16 may use this information to determine the amount of lens adjustment needed to bring an object of interest into focus.

Shielded photodiodes PD2, PD4, PD5, and PD7 may, if desired, be used to collect overflow charge from photodiodes PD1, PD3, PD6, and PD8, respectively, during charge integration. For example, a blooming path may be formed between photodiodes PD1 and PD2 to increase the full-well capacity of pixel 1. Similar blooming paths may be formed between photodiodes PD3 and PD4, PD5 and PD6, and PD7 and PD8, if desired.

Figure 11A:
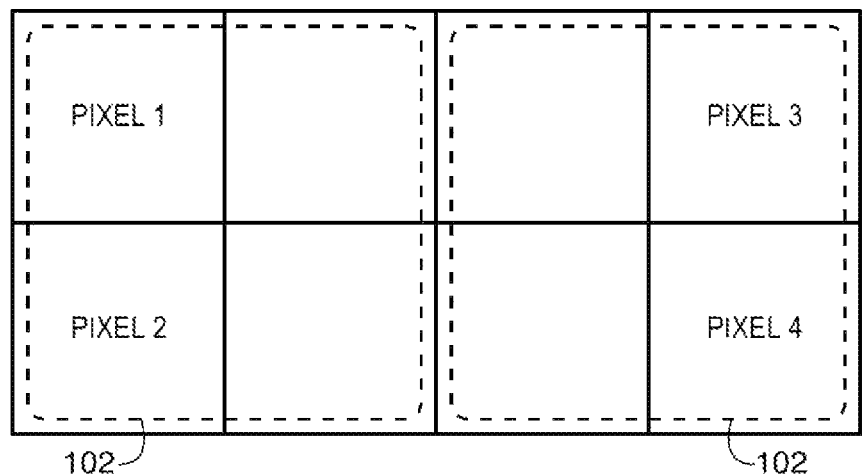
FIGS. 11A and 11B show respective top and cross-sectional views of an illustrative arrangement in which a phase detection pixel group includes first and second pixel pairs covered by respective first and second microlenses in accordance with an embodiment of the present invention.
Figure 11B:
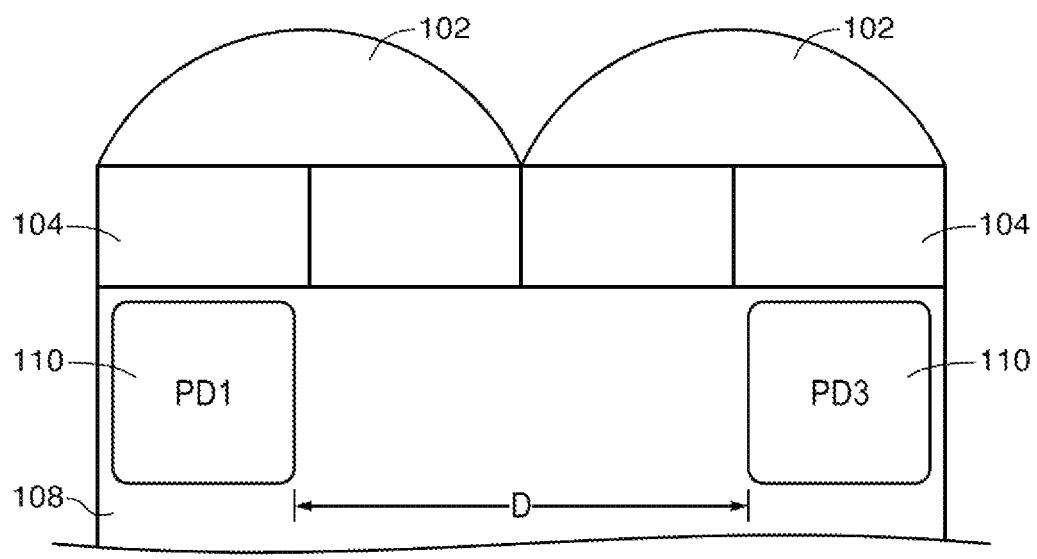

FIGS. 11A and 11B show respective top and cross-sectional side views of an illustrative arrangement similar to that shown in FIG. 9A except that the middle four pixel regions are free of photosensitive regions. As shown in FIG. 11A, Pixels 1 and 2 include respective photodiodes PD1 and PD2 covered by an associated microlens 102, and Pixels 3 and 4 include respective photodiodes PD3 and PD4 covered by an associated microlens 102. The centers of photodiodes PD1, PD2, PD3, and PD4 may each be offset from (i.e., not aligned with) optical axis 116 of associated microlens 102. The portion of substrate 108 that extends between PD1 and PD3 (and between PD2 and PD4) is free of photosensitive regions.

With a configuration of the type shown in FIG. 11A, phase difference information may be determined using signals gathered by photodiodes PD1, PD2, PD3 and PD4. For example, determining a phase difference signal may include summing pixel signals from PD1 and PD2, summing pixel signals from PD3 and PD4, and determining a difference between the two sums.

If desired, the distance D between photodiodes PD1 and PD3 (and between PD2 and PD4) and the size of photodiodes 110 may be adjusted to optimize image sensor performance (e.g., may be adjusted to balance image sensor performance parameters such as phase separation, pixel sensitivity, full-well capacity, etc.).

Figure 12A:
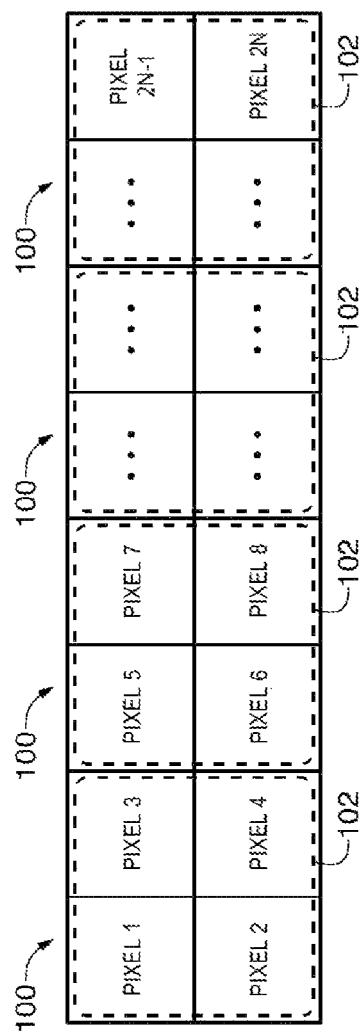
FIGS. 12A and 12B show respective top and cross-sectional views of an illustrative arrangement in which a plurality of phase detection pixel groups with four photodiodes in each group are arranged consecutively in a line in accordance with an embodiment of the present invention.
Figure 12B:
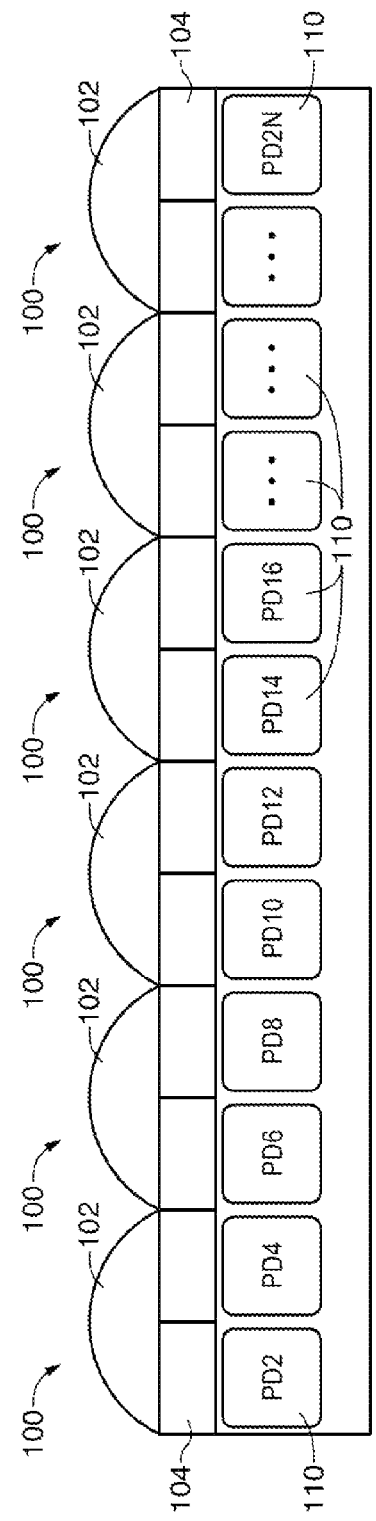

FIGS. 12A and 12B show respective top and cross-sectional side views of an illustrative arrangement in which a plurality of phase detection pixel groups 100 of the type shown in FIG. 8A are arranged consecutively in a line. As shown in FIG. 12A, each pixel group 100 includes four pixels covered by a single microlens 102. This type of arrangement may sometimes referred to as a 2×N or N×2 arrangement.

An arrangement of the type shown in FIG. 12A may be used in various ways. If desired, pixel groups 100 may each be used to gather phase information and the data gathered by the groups may be averaged to increase the accuracy of the phase difference signal. Also, by arranging pixel groups 100 in a line, image processing circuitry 16 may use phase detection pixel data from any suitable pixel or group of pixels in groups 100. For example, during automatic focusing operations, phase detection pixel data may be gathered using all phase detection pixels, and image processing circuitry 16 of FIG. 1 may determine which phase detection pixel data to use to determine phase difference information for automatic focusing.

Pixel data from any suitable group of photodiodes 110 may be used to determine phase difference information. For example, phase difference information may be determined by summing pixel data from PD1 and PD2, summing pixel data from PD3 and PD4, and determining a difference between the two sums. As another example, phase difference information may be determined by summing pixel data from PD1 and PD2, summing pixel data from PD7 and PD8, and determining the difference between the two sums. These examples are merely illustrative. In general, any group of photodiodes with complementary directional sensitivity (e.g., a first pair of photodiodes that are more sensitive to light with positive angles of incidence than light with negative angles of incidence and a second pair of photodiodes that are more sensitive to light with negative angles of incidence than light with positive angles of incidence) may be used in determining a phase difference signal. If desired, image processing circuitry 16 may switch from using data from one pixel group during a first automatic focusing operation to using data from another pixel group during a second automatic focusing operation.

Figure 13A:
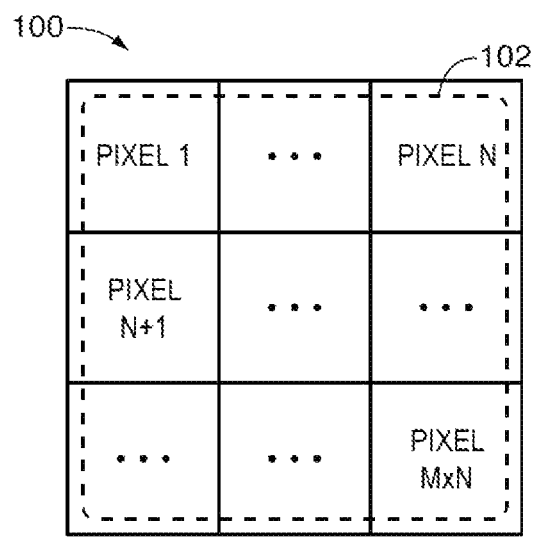
FIGS. 13A and 13B show respective top and cross-sectional views of an illustrative phase detection pixel group having M rows and N columns of photodiodes covered by a single microlens in accordance with an embodiment of the present invention.
Figure 13B:
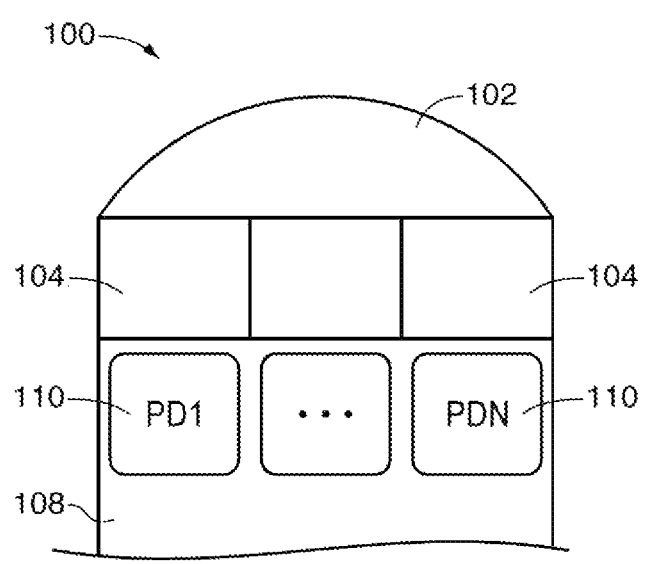

The examples of FIGS. 8A-12B in which each photodiode 110 consumes about one fourth of the substrate area under microlens 102 is merely illustrative. If desired, the size of microlens 102 (or photodiode 110) may be adjusted such that each phase detection photodiode 110 consumes less than one fourth of the substrate area under microlens 102. FIG. 13A shows a top view of an illustrative arrangement in which a single microlens 102 covers M×N phase detection pixels in an M×N arrangement. With this type of configuration, phase detection pixel group 100 includes M×N pixels arranged in M rows and N columns, with each pixel having an associated photodiode 110.

Using the M×N arrangement of FIG. 13A in which microlens 102 covers M×N photodiodes 110, phase detection pixel group 100 may be used to gather phase information on horizontally oriented edges, vertically oriented edges, and edges that are oriented at various tilted angles.

Image processing circuitry 16 may perform any number of operations using pixel data from pixel group 100 to determine phase information. If desired, all M×N phase detection pixels in group 100 may gather phase information and image processing circuitry 16 may determine which data to use after it has been gathered. For example, image processing circuitry 16 may only use a portion of the gathered data.

If desired, pixel groups 100 of the type shown in FIG. 13A may be arranged consecutively in a line (e.g., similar to the arrangement of FIG. 12A). As in the example of FIG. 12A, pixel data from any suitable group of photodiodes 110 may be used to determine phase difference information. In general, any group of photodiodes with complementary directional sensitivity (e.g., including a first group of photodiodes that are more sensitive to light with positive angles of incidence than light with negative angles of incidence and a second group of photodiodes that are more sensitive to light with negative angles of incidence than light with positive angles of incidence) may be used in determining a phase difference signal. If desired, image processing circuitry 16 may switch from using data from one pixel group during a first automatic focusing operation to using data from another pixel group during a second automatic focusing operation.

Phase detection pixels with larger microlenses (e.g., microlenses that cover two or more pixels) may have higher sensitivity than pixels with smaller microlenses (e.g., microlenses that cover a single pixel). If desired, phase detection pixels with larger microlenses may be provided with an adjustable gain or may be provided with a gain commensurate with the increased pixel sensitivity (e.g., a gain that is lower than that of pixels with smaller microlenses).

Figure 14:
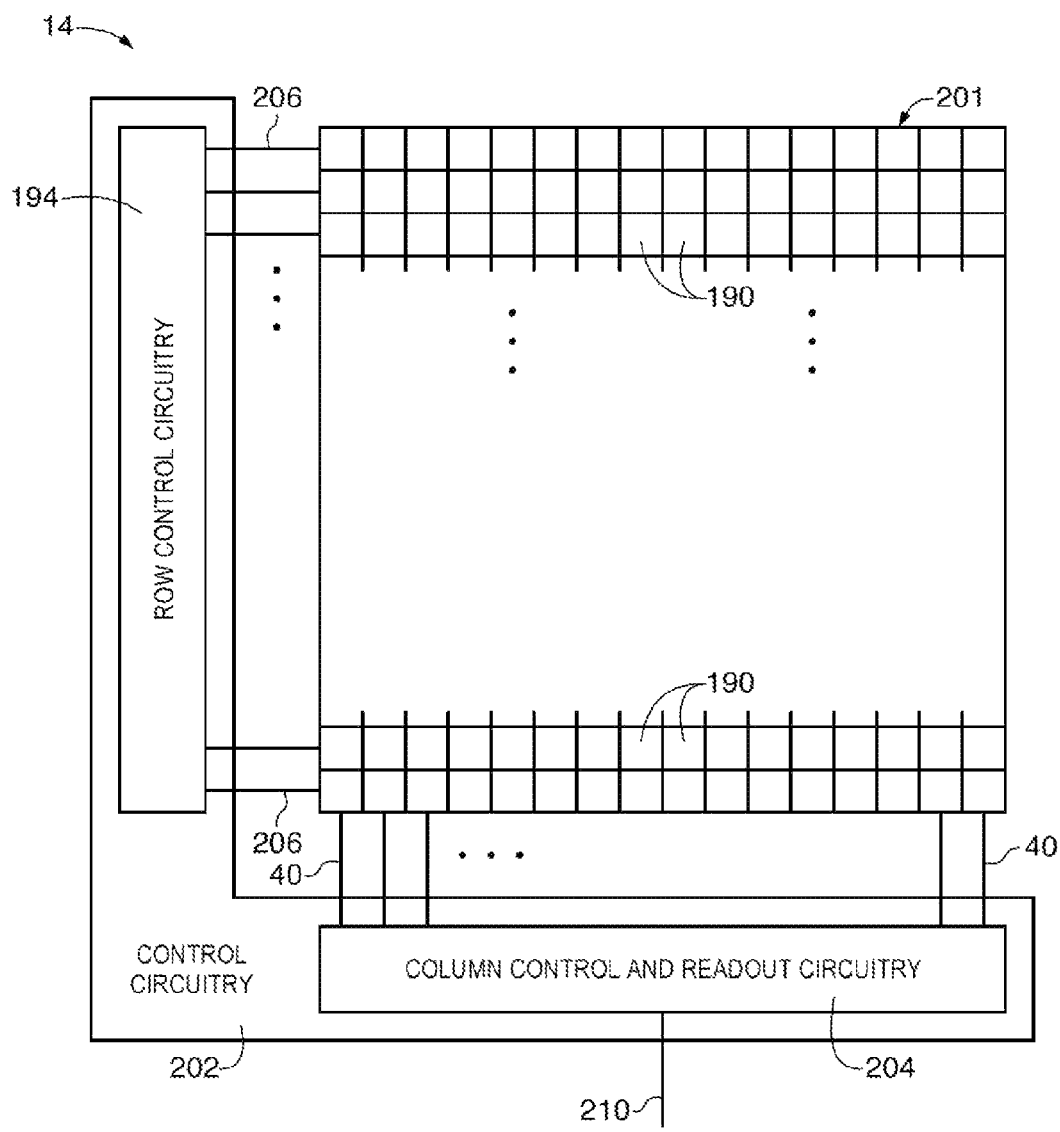
FIG. 14 is a diagram of an illustrative image sensor having a pixel array with phase detection pixels and associated control circuitry for generating control signals and bias signals and reading out pixel data in accordance with an embodiment of the present invention.

FIG. 14 illustrates a simplified diagram of an illustrative image sensor 14, for example a CMOS imager, employing a pixel array 201 having phase detection pixels. Pixel array 201 includes a plurality of pixels 190 (e.g., phase detection pixels and imaging pixels) arranged in rows and columns. Imaging pixels 190 in pixel array 201 may be configured to gather image data to be used in generating images of a scene. Phase detection pixels 190 in pixel array 201 (e.g., phase detection pixels having a configuration of the type shown in any one of FIGS. 2A-13B) may be configured to gather phase information to be used for a specific application such as automatic focusing operations, depth mapping, and/or 3D imaging.

For example, phase information gathered by phase detection pixels in pixel array 201 may be used to automatically and rapidly adjust image sensor optics (e.g., lenses 28 of FIG. 1) to bring an object of interest into focus before capturing an image.

Array 201 may contain, for example, hundreds or thousands of rows and columns of pixels 190. Control circuitry 202 may include row control circuitry 194 and column circuitry such as column control and readout circuitry 204. Row control circuitry 194 may be used to supply control signals such as reset, transfer, and read control signals to pixels 190 over control paths 206. One or more conductive lines such as column lines 40 may be coupled to each column of pixels in array 201. Column lines 40 may be used for reading out pixel signals from pixels 190 and for supplying bias signals (e.g., bias currents or bias voltages) to pixels 190. During pixel readout operations, a pixel row in array 201 may be selected by row control circuitry 194 and pixel data associated with pixels 190 in that pixel row can be read out along column lines 40.

Column circuitry such as column control and readout circuitry 204 may be coupled to pixels 190 and application-specific pixels 212 using column lines 40. Column circuitry 204 may include sample-and-hold circuitry, amplifier circuitry, analog-to-digital conversion circuitry, bias circuitry such as pixel column bias supply circuits (e.g., circuitry such as current mirror circuitry for providing bias currents to source follower transistors of pixels 190 along a pixel column), memory or other circuitry for operating pixels 190 and for reading out pixel signals from pixels 190.

If desired, image sensor 14 may employ a special readout mode for reading out pixel signals from phase detection pixels. For example, when it is desired to read out pixel signals from phase detection pixels (e.g., during an automatic focusing operation), control circuitry 202 may only read out rows or columns that contain phase detection pixels. If desired, control circuitry 202 may read out individual phase detection pixels or may read out only a portion of phase detection pixels corresponding to a region of interest (e.g., phase detection pixels in the center or at the edges of array 201). Image processing circuitry 16 of FIG. 1 may use this phase detection pixel data to determine what lens adjustment is needed to bring an object of interest into focus. After the lens is adjusted to bring the object of interest into focus, control circuitry 202 may read out pixel signals from the entire array 201 to capture an image of the focused object.

By only reading out phase detection pixel signals during automatic focusing operations, the amount of data associated with the read out operation is less than the data associated with reading out a full image frame. This in turn may reduce the time between automatic focusing and image capture.

Phase detection pixels may be formed in any suitable location in array 201. For example, phase detection pixels may be located at the center of array 201 and across array 201 in all directions. Phase detection pixels may be arranged as one or more rows in array 201, one or more columns in array 201, one or more clusters of pixels in array 201 (e.g., one or more sub-arrays in array 201 such as a 2×1, 1×2, 4×1, 1×4, or 2×2 group of phase detection pixels), one or more single pixels in array 201, etc. Distributing phase detection pixels across array 201 may allow array 201 to be used in producing a depth map of a scene. If desired, the density of phase detection pixels across array 201 may be determined based on the desired resolution of the depth map.

Various embodiments have been described illustrating image sensors with phase detection capabilities.

An image sensor may include a pixel array having a plurality of pixels that receive incoming light and convert the received light into electrical signals. One or more imaging lenses may be used to focus incoming light onto the pixel array. A plurality of microlenses may be formed over pixels in the pixel array to focus light from the imaging lens through a color filter onto a photodiode in a substrate region.

The pixel array may include one or more phase detection pixels. Pixel data from phase detection pixels may be used for applications such as automatic focusing operations, depth mapping, and 3D imaging.

Phase detection pixels may include photodiodes with asymmetric angular responses. For example, the center of a photodiode in a phase detection pixel may be offset (e.g., not aligned with) the optical center of the microlens that covers that photodiode. The asymmetric angular response of phase detection pixels may be used in gathering phase information from a scene. For example, phase information can be determined using a first pixel group having a first angular response and a second pixel group having a second angular response that is inverted from the first angular response. Phase information may be used to determine the amount by which image sensor optics (e.g., one or more imaging lenses) need to be adjusted to bring an object of interest into focus (e.g., during automatic focusing operations).

Phase detection pixels may be arranged in various ways. For example, a group of two, three, four, or more than four phase detection pixels may be clustered together and covered by a single microlens. Groups of these clusters may be arranged consecutively in a line. Phase detection data may be gathered using all of the phase detection pixels in the array, and image processing circuitry may determine which phase detection data to use after the data has been gathered. For example, during a first automatic focusing operation, image processing circuitry may use pixel data from a first group of phase detection pixels (e.g., a first group of pixels under a single microlens). During a second automatic focusing operation, imaging processing circuitry may use pixel data from a second group of phase detection pixels (e.g., a second group of pixels including pixels under a first microlens and pixels under a second microlens).

The foregoing is merely illustrative of the principles of this invention and various modifications can be made by those skilled in the art without departing from the scope and spirit of the invention.

What is claimed is:

1. An imaging device having an image pixel array with a plurality of phase detection pixels arranged consecutively in a line, wherein the plurality of phase detection pixels comprises:

first and second photosensitive regions formed in a substrate and covered by a first microlens; and third and fourth photosensitive regions formed in the substrate and covered by a second microlens, wherein the first microlens is directly adjacent to the second microlens and wherein the second and third photosensitive regions are interposed between the first and fourth photosensitive regions, wherein the first microlens has a first optical axis, wherein the second microlens has a second optical axis, wherein the first and second photosensitive regions are offset from the first optical axis, and wherein the third and fourth photosensitive regions are offset from the second optical axis.

2. The imaging device array defined in claim 1 further comprising a plurality of color filter elements interposed between the substrate and the first and second microlenses.

3. The imaging device defined in claim 2 further comprising an opaque shielding layer formed over the second and third photosensitive regions.

4. The imaging device defined in claim 3 wherein the opaque shielding layer comprises metal.

5. The imaging device defined in claim 3 wherein the second and third photosensitive regions are configured to collect overflow charge respectively from the first and fourth photosensitive regions during charge integration.

6. The imaging device defined in claim 1 further comprising processing circuitry configured to determine a first phase difference signal based on pixel signals from the first and second photosensitive regions and a second phase difference signal based on pixel signals from the first and fourth photosensitive regions.

7. The imaging device defined in claim 6 wherein the plurality of phase detection pixels further comprises:
fifth and sixth photosensitive regions formed in the substrate and covered by a third microlens, wherein the second microlens is directly interposed between the first and the third microlenses, and wherein the processing circuitry is configured to determine a third phase difference signal based on pixel signals from the first and sixth photosensitive regions.

8. The imaging device defined in claim 1 further comprising:
at least one lens configured to focus incoming light onto the image pixel array; and
processing circuitry configured to determine an amount by which the lens needs to be adjusted during automatic focusing operations based on pixel signals from the plurality of phase detection pixels.

9. The imaging device defined in claim 1, wherein the first microlens has first and second opposing halves, wherein the first photosensitive region is formed under only the first half of the first microlens, wherein the second photosensitive region is formed under only the second half of the first microlens, wherein the second microlens has first and second opposing halves, wherein the third photosensitive region is formed under only the first half of the second microlens, wherein the second photosensitive region is formed under only the second half of the second microlens, the imaging device further comprising an opaque shielding layer formed over only the second and third photosensitive regions.

10. An imaging device having an image pixel array with a group of phase detection pixels located adjacent to one another, wherein the group of phase detection pixels comprises:
first, second, third, and fourth photosensitive regions formed in a substrate and covered by a microlens; and
processing circuitry configured to determine a phase difference signal based on pixel signals from the first, second, third, and fourth photosensitive regions, the imaging device further comprising a second group of phase detection pixel located adjacent to the group of phase detection pixels, wherein the second group of phase detection pixels comprises fifth, sixth, seventh, and eighth photosensitive regions formed in the substrate and covered by a second microlens, and wherein the group of phase detection pixels and the second group of phase detection pixels form a 2×4 sub-array in the image pixel array.

11. The imaging device defined in claim 10 wherein the microlens has an optical axis and wherein the first, second, third, and fourth photosensitive regions are offset from the optical axis.

12. The imaging device defined in claim 10 further comprising a metal shielding layer formed over at least some of the photosensitive regions.

13. The imaging device defined in claim 10 wherein the processing circuitry is configured to determine vertical and horizontal phase information.

14. The imaging device defined in claim 10 further comprising:
at least one lens configured to focus incoming light onto the image pixel array; and
processing circuitry configured to determine an amount by which the lens needs to be adjusted during automatic focusing operations based on pixel signals from the group of phase detection pixels.

15. An imaging device having an image pixel array with at least one phase detection pixel, wherein the at least one phase detection pixel comprises:
a first photosensitive region formed in a substrate and covered by a first microlens, wherein the first microlens has first and second opposing halves, and wherein the first photosensitive region is formed under only the first half of the first microlens;
a second photosensitive region formed in the substrate and covered by a second microlens, wherein the second microlens has first and second opposing halves, and wherein the second photosensitive region is formed under only the second half of the second microlens, wherein the first and second microlenses are directly adjacent to one another such that the second half of the first microlens is directly adjacent to the first half of the second microlens, and wherein the substrate has a portion that extends from the first photosensitive region to the second photosensitive region that is free of photosensitive regions.

16. The imaging device defined in claim 15 further comprising processing circuitry that is configured to determine a phase difference signal based on pixel signals from the first photosensitive region and the second photosensitive region.

17. The imaging device defined in claim 15 further comprising:
a third photosensitive region formed in the substrate and covered by the first microlens;
a fourth photosensitive region formed in the substrate and covered by the second microlens, wherein the portion of the substrate that is free of photosensitive regions extends from the third photosensitive region to the fourth photosensitive region.

18. The imaging device defined in claim 15 wherein the first microlens has a first optical axis, wherein the second microlens has a second optical axis, wherein a center of the first photosensitive region is offset from the first optical axis, and wherein a center of the second photosensitive region is offset from the second optical axis.

19. The imaging device defined in claim 16, wherein no photosensitive regions are formed under the second half of the first microlens, and wherein no photosensitive regions are formed under the first half of the second microlens.

20. The imaging device defined in claim 17, wherein the third photosensitive region is formed under only the first half of the first microlens, and wherein the fourth photosensitive region is formed under only the second half of the second microlens.

* * * * *